United States Patent
Jung et al.

(10) Patent No.: US 11,652,065 B2
(45) Date of Patent: May 16, 2023

(54) SEMICONDUCTOR DEVICE AND METHOD OF EMBEDDING CIRCUIT PATTERN IN ENCAPSULANT FOR SIP MODULE

(71) Applicant: STATS ChipPAC Pte. Ltd., Singapore (SG)

(72) Inventors: JinHee Jung, Incheon (KR); ChangOh Kim, Incheon (KR); HeeSoo Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 94 days.

(21) Appl. No.: 17/307,727

(22) Filed: May 4, 2021

(65) Prior Publication Data

US 2022/0359418 A1    Nov. 10, 2022

(51) Int. Cl.
| | |
|---|---|
| *H01L 23/31* | (2006.01) |
| *H01L 23/552* | (2006.01) |
| *H01L 23/16* | (2006.01) |
| *H01L 25/10* | (2006.01) |
| *H01L 25/00* | (2006.01) |
| *H01L 23/538* | (2006.01) |

(52) U.S. Cl.
CPC ............ *H01L 23/552* (2013.01); *H01L 23/16* (2013.01); *H01L 23/3107* (2013.01); *H01L 23/5386* (2013.01); *H01L 25/105* (2013.01); *H01L 25/50* (2013.01); *H01L 2225/1041* (2013.01)

(58) Field of Classification Search
CPC ..................................................... H01L 23/552
See application file for complete search history.

(56) References Cited

U.S. PATENT DOCUMENTS

| | | | | |
|---|---|---|---|---|
| 7,633,765 | B1* | 12/2009 | Scanlan | H01L 23/5389 174/262 |
| 8,283,205 | B2* | 10/2012 | Pagaila | H01L 25/03 438/618 |
| 9,202,742 | B1 | 12/2015 | Kim et al. | |
| 2021/0257227 | A1* | 8/2021 | Wang | H01L 24/97 |
| 2021/0257337 | A1* | 8/2021 | Park | H01L 25/0652 |

* cited by examiner

*Primary Examiner* — Thao P Le
(74) *Attorney, Agent, or Firm* — Robert D. Atkins; Patent Law Group: Atkins & Associates, P.C.

(57) ABSTRACT

An SIP module includes a plurality of electrical components mounted to an interconnect substrate. The electrical components and interconnect substrate are covered by an encapsulant. A conductive post is formed through the encapsulant. A plurality of openings is formed in the encapsulant by laser in a form of a circuit pattern. A conductive material is deposited over a surface of the encapsulant and into the openings to form an electrical circuit pattern. A portion of the conductive material is removed by a grinder to expose the electrical circuit pattern. The grinding operation planarizes the surface of the encapsulant and the electrical circuit pattern. The electrical circuit pattern can be a trace, contact pad, RDL, or other interconnect structure. The electrical circuit pattern can also be a shielding layer or antenna. An electrical component is disposed over the SIP module and electrical circuit pattern.

28 Claims, 12 Drawing Sheets

SEMICONDUCTOR DEVICE AND METHOD OF EMBEDDING CIRCUIT PATTERN IN ENCAPSULANT FOR SIP MODULE

FIELD OF THE INVENTION

The present invention relates in general to semiconductor devices and, more particularly, to a semiconductor device and method of embedding a circuit pattern in the encapsulant of a system-in-package (SIP) module.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A common design goal for a semiconductor device is to reduce the footprint and profile, while gaining in functionality. The semiconductor devices need to accommodate a higher density of components in a smaller area. In many known package layouts, a bottom interconnect substrate provides mechanical and electrical connectivity with a circuit pattern or RDL formed on the substrate to support external electrical interconnect to the semiconductor device. It is desirable to have a constant or uniform thickness of the circuit pattern, although difficult to control. An irregular thickness of the circuit pattern may cause interconnect cracking and assembly problems. In addition, the interconnect substrate with its corresponding circuit pattern adds to the height of the overall semiconductor package, which is counter to design goals.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
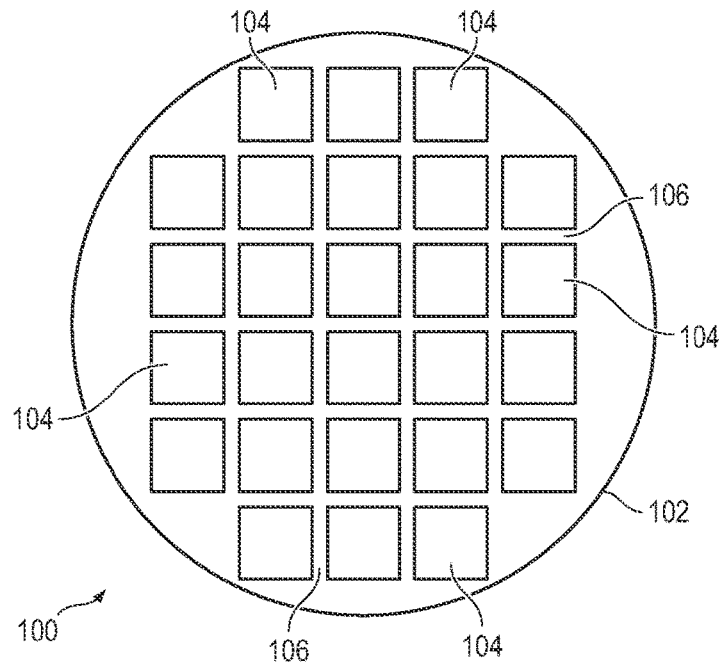
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
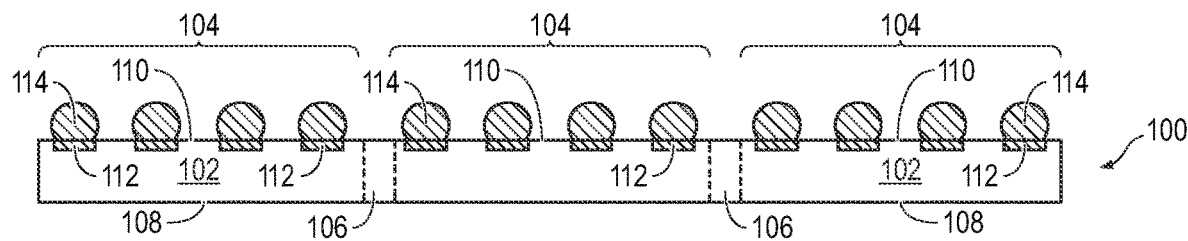

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
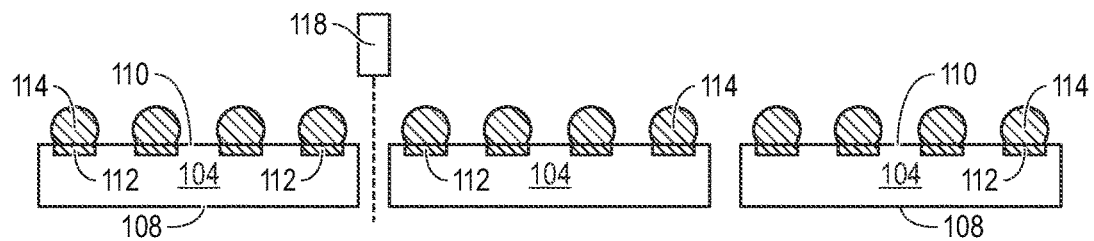

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
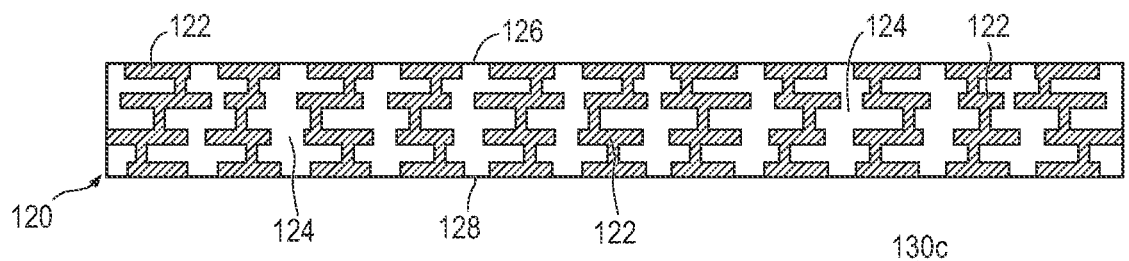
FIGS. 2a-2n illustrate a process of embedding a circuit pattern in the encapsulant of an SIP module.
Figure 2B:
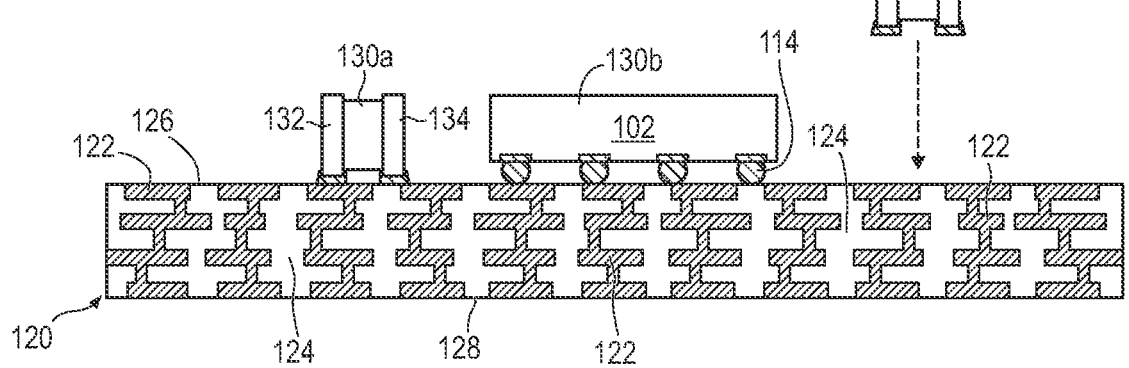
Figure 2C:
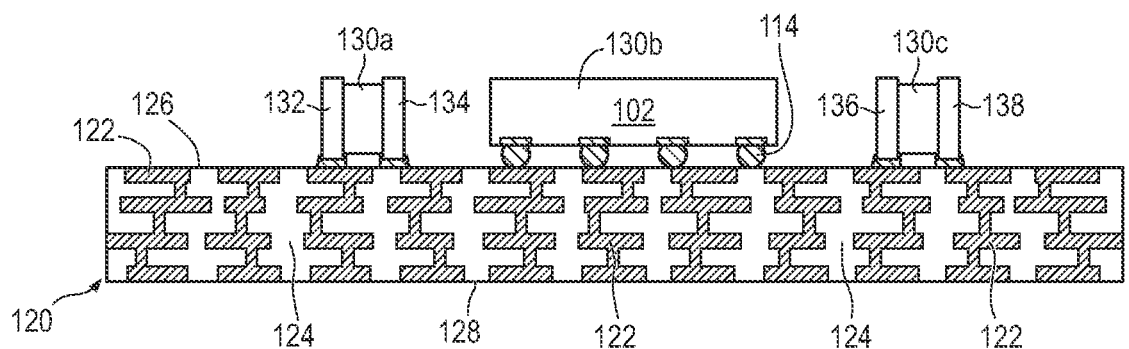
Figure 2D:
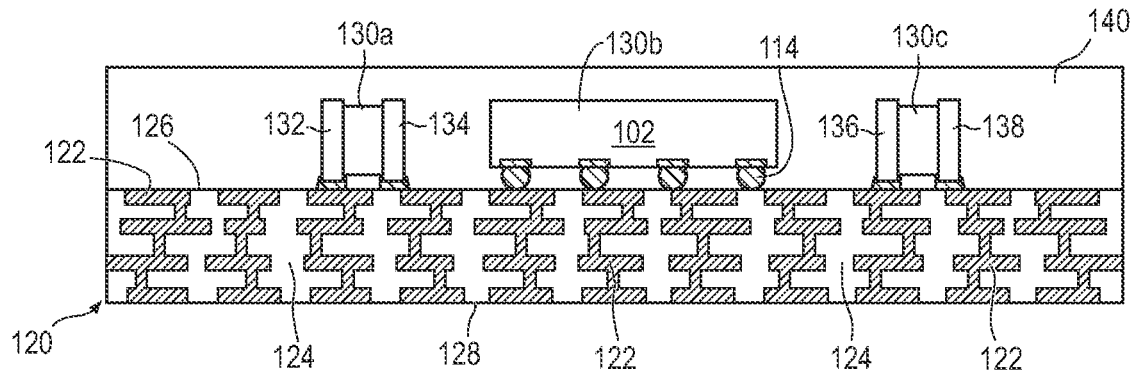
Figure 2E:
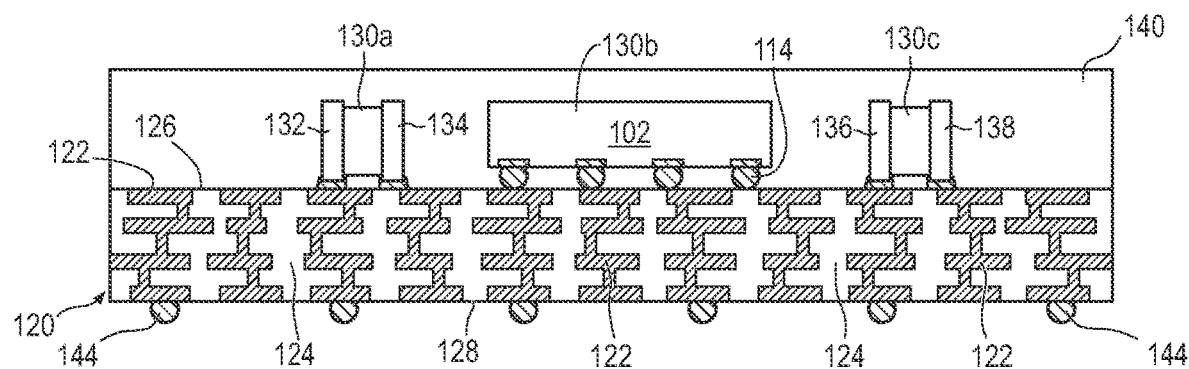
Figure 2F:
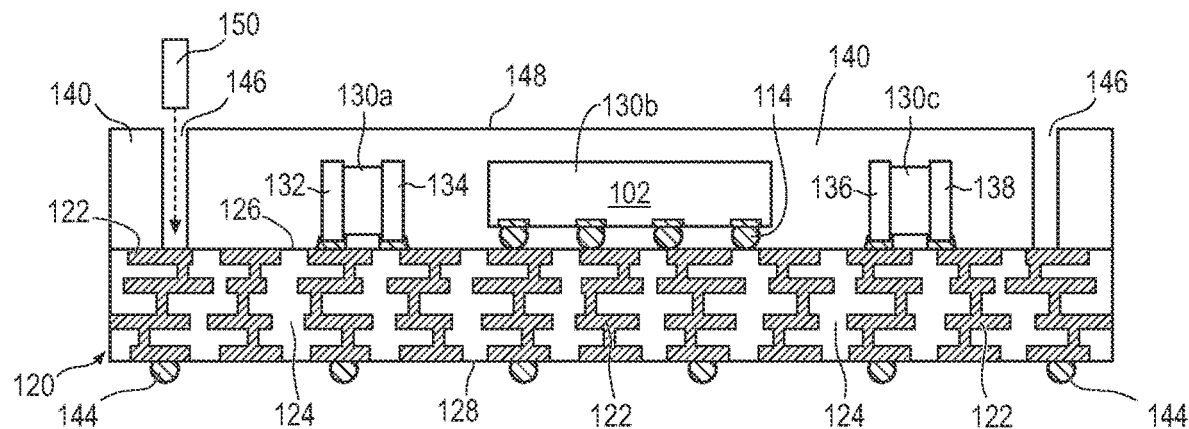
Figure 2G:
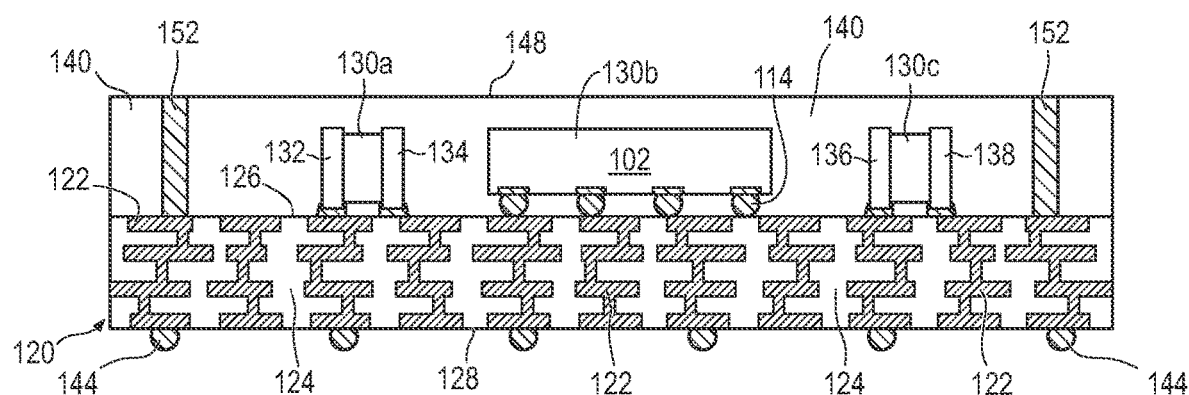
Figure 2H:
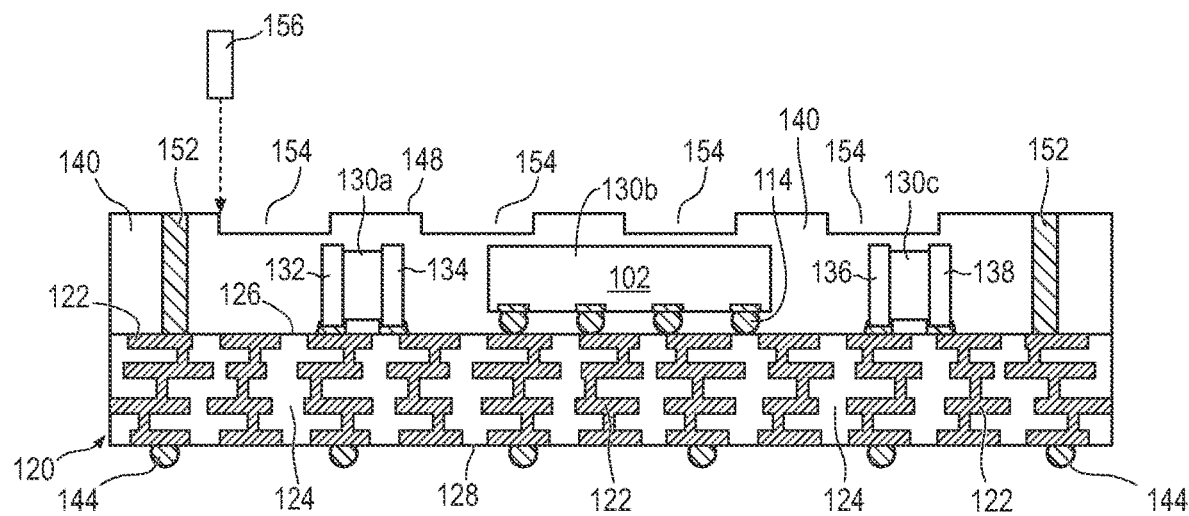
Figure 2I:
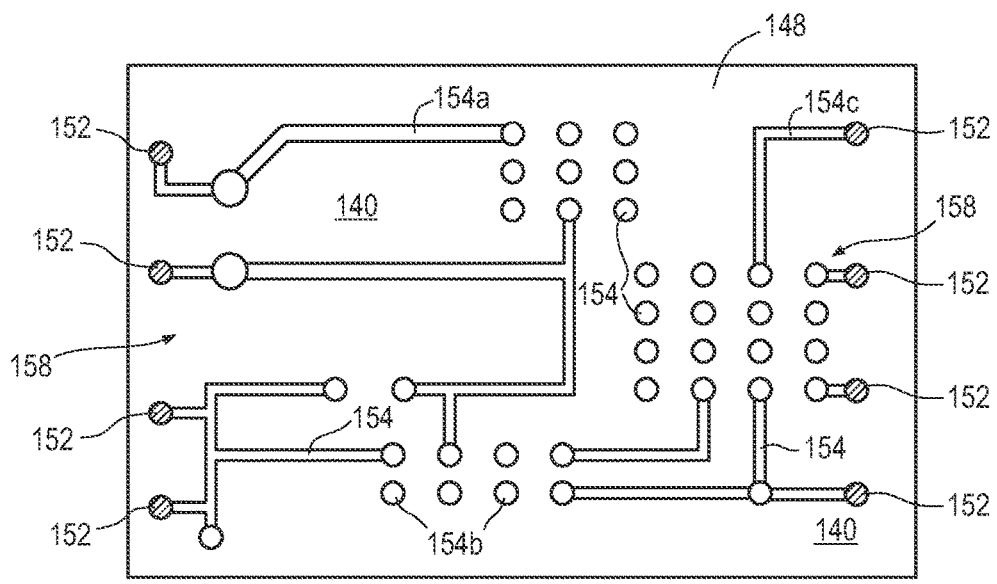
Figure 2J:
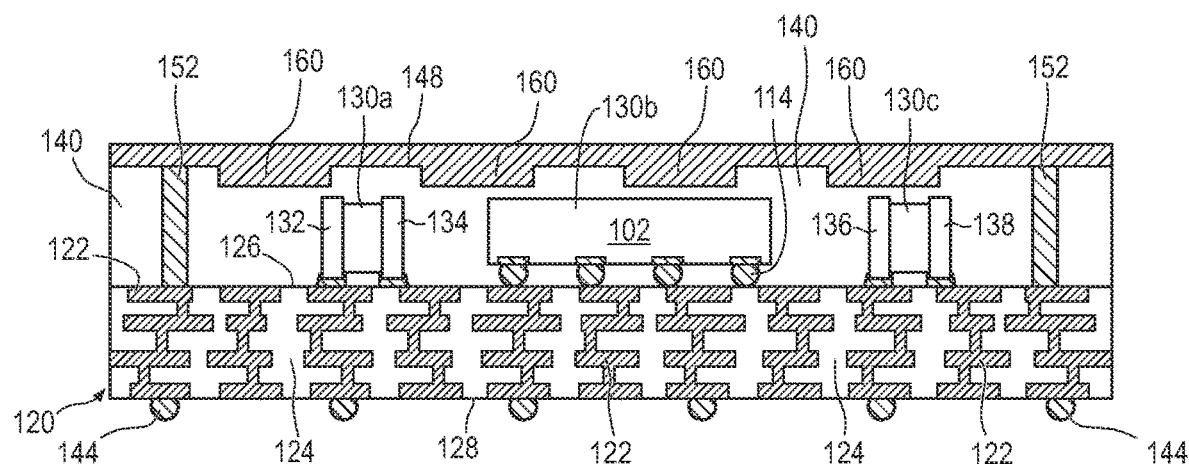
Figure 2K:
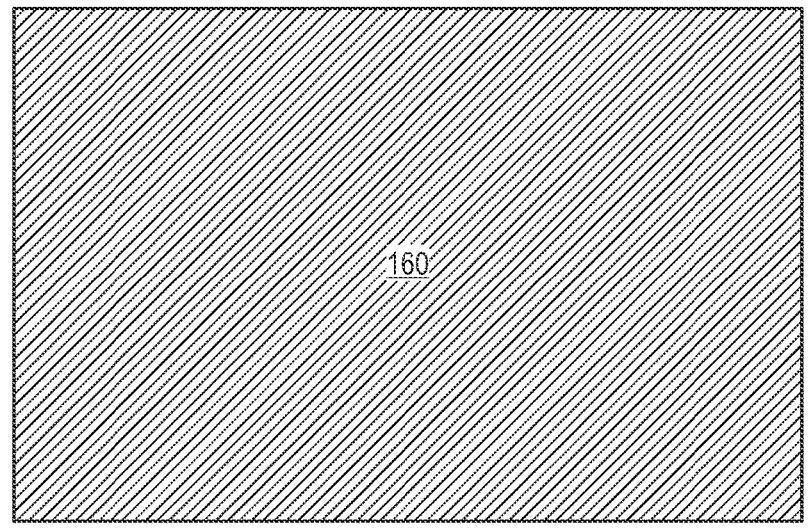
Figure 2L:
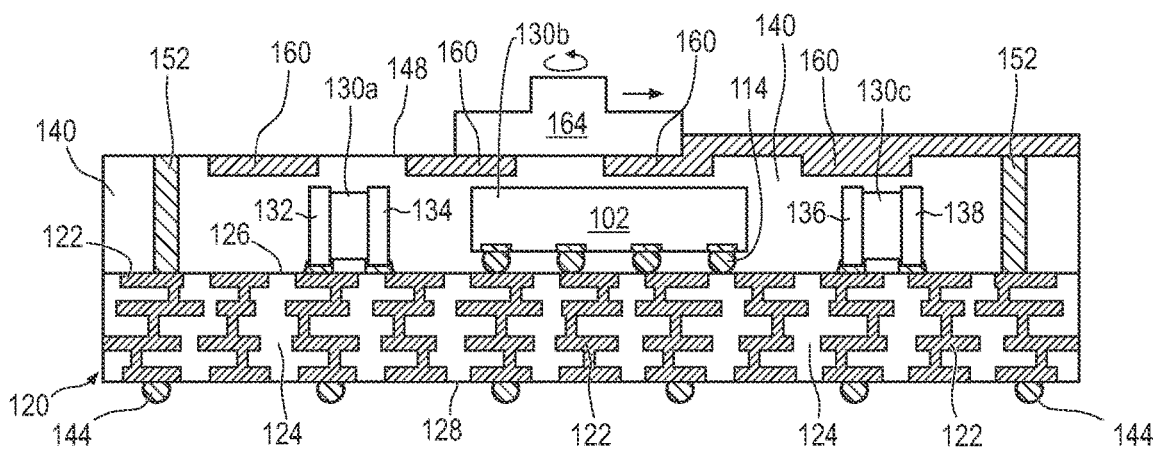
Figure 2M:
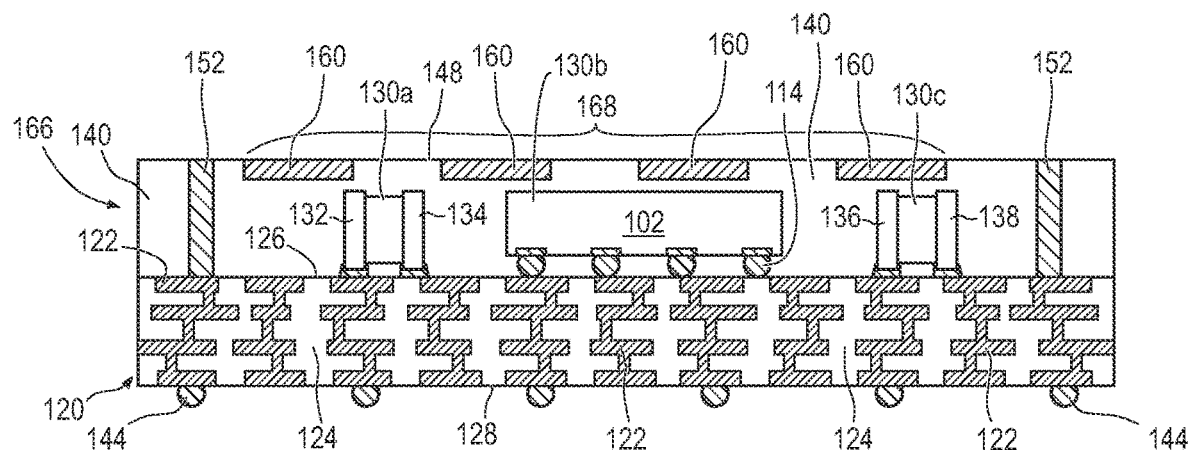
Figure 2N:
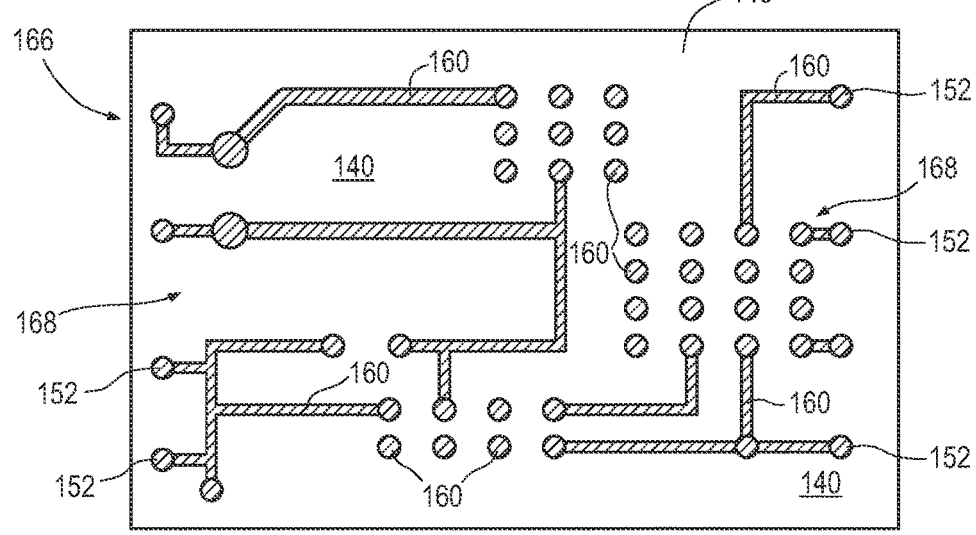

FIGS. 2a-2n illustrate a process of disposing electrical components over an interconnect substrate to form an SIP module or electric component assembly. An electrical circuit pattern is then embedded in the encapsulant of the SIP module. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

In FIG. 2b, a plurality of electrical components 130a-130c is mounted to surface 126 of interconnect substrate 120 and electrically and mechanically connected to conductive layers 122. Electrical components 130a-130c are each positioned over substrate 120 using a pick and place operation. For example, electrical component 130b can be semiconductor die 104 from FIG. 1c with active surface 110 and bumps 114 oriented toward surface 126 of substrate 120 and electrically connected to conductive layer 122. Electrical component 130a and 130c are discrete electrical devices or IPDs, such as a resistor, capacitor, and inductor. Electrical component 130a uses terminals 132 and 134 to make electrical and mechanical connection to conductive layer 122 on interconnect substrate 120. Electrical component 130c uses terminals 136 and 138 to make electrical and mechanical connection to conductive layer 122 on interconnect substrate 120. Alternatively, electrical components 130a-130c can include other semiconductor die, semiconductor packages, surface mount devices, discrete electrical devices, or IPDs, such as a resistor, capacitor, and inductor. Electrical components 130a-130d are mounted to interconnect substrate 120, as shown in FIG. 2c, with bumps 114 and terminals 132-138 making mechanical and electrical connection to conductive layer 122.

In FIG. 2d, an encapsulant or molding compound 140 is deposited over and around electric components 130a-130c and substrate 120 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants.

In FIG. 2e, an electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 144. In one embodiment, bump 144 is formed over a UBM having a wetting layer, barrier layer, and adhesive layer. Bump 144 can also be compression bonded or thermocompression bonded to conductive layer 122. Bump 144 represents one type of interconnect structure that can be formed over conductive layer 122. The interconnect structure can also use bond wires, conductive paste, stud bump, micro bump, or other electrical interconnect.

In FIG. 2f, a plurality of vias 146 is formed into surface 148 of encapsulant 140 using etching, drilling, or laser direct ablation (LDA) with laser 150. Vias 146 are aligned with and extend to portions of conductive layer 122 on interconnect substrate 120. In FIG. 2g, vias 146 are filled with Al, Cu, Sn, Ni, Au, Ag, Ti, W, poly-silicon, or other suitable electrically conductive material using paste printing and reflow, electrolytic plating, electroless plating process, or other suitable metal deposition process to form z-direction vertical conductive posts 152. Conductive posts 152 are electrically connected to conductive layer 122.

In FIG. 2h, a plurality of openings 154 is formed in surface 148 of encapsulant 140 using etching or LDA with laser 156. Openings 154 are arranged in a circuit pattern designated to interconnect various electric components via traces, redistribution layer (RDL), contact pads, and other interconnect structure. FIG. 2i shows a top view of openings 154 formed in surface 148 of encapsulant 140 as general circuit pattern 158. For example, opening 154a will form a trace line, opening 154b will form a contact pad, and opening 154c will form an RDL. Openings 154 are shown wide in FIGS. 2h-2i for illustration purposes, i.e., the openings are not to scale. In practice, openings 154 correspond to a width of features in an actual semiconductor scale circuit pattern.

In FIG. 2j, a conductive material 160 is conformally applied to surface 148 using electrolytic plating, electroless plating process, sputtering, or other suitable metal deposition process. Conductive material 160 can be Al, Cu, Sn, Ni, Au, Ag, Ti, W, poly-silicon, or other suitable electrically conductive material. Conductive material 160 is disposed over or covers surface 148 and fills openings 154, including all portions of circuit pattern 158. Conductive material 160 contacts conductive posts 152. FIG. 2k shows a top view of conductive material 160 disposed over or covering surface 148 and filling openings 154, including all portions of circuit pattern 158.

In FIG. 2l, a portion of conductive layer 160 is removed by grinder 164 to expose surface 148 and the conductive material in openings 154. The portion of conductive material in openings 154 remains in place. Grinder 164 planarizes surface 148 of encapsulant 140 and the surface of conductive material 160. Alternatively, a portion of conductive material 160 is removed by chemical etching, chemical mechanical polishing (CMP), or LDA to expose surface 148 and the conductive material in openings 154. FIG. 2m shows SIP module or semiconductor component assembly 166 post-grinding with conductive material 160 in openings 154. In fact, the grinding process exposes conductive material 160 in openings 154 to form an electrical circuit pattern 168, as shown in FIG. 2n. Accordingly, electrical circuit pattern 168 is embedded with encapsulant 140.

Figure 3A:
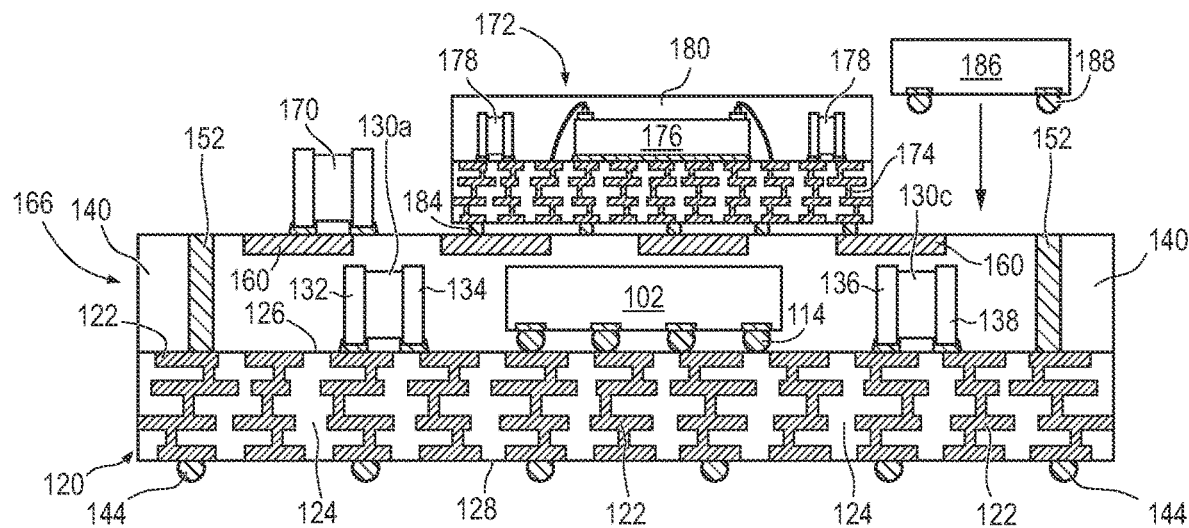
FIGS. 3a-3b illustrate mounting electrical components to the circuit pattern in the SIP module.
Figure 3B:
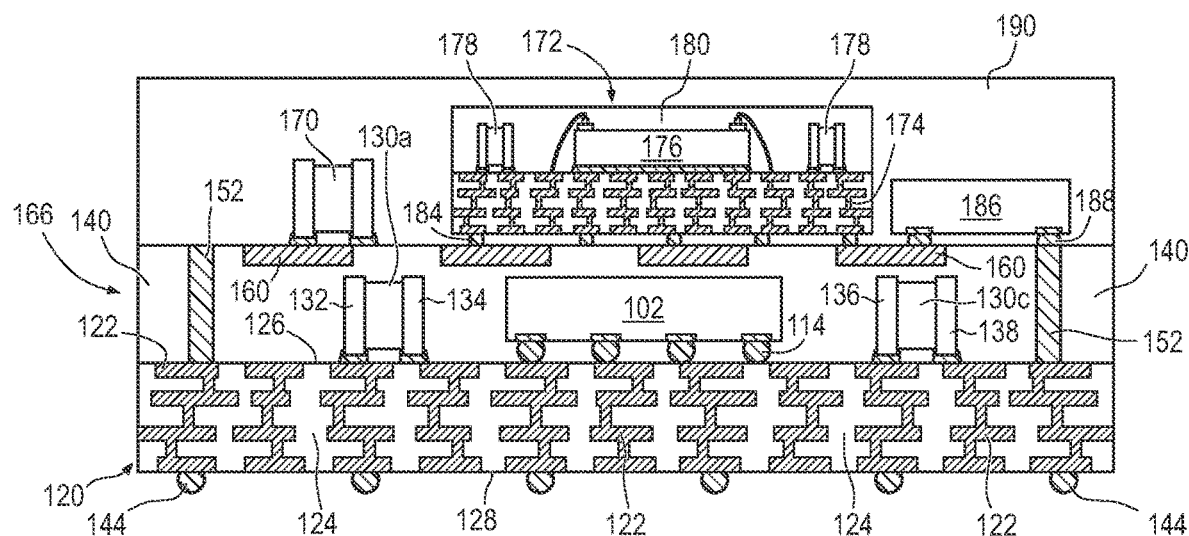

Various electrical components can be mounted to electrical circuit pattern 168 from FIGS. 2m-2n. In FIG. 3a, the electrical components are each positioned over encapsulant 140 and electrical circuit pattern 168 using a pick and place operation. The electrical components are mounted to electrical circuit pattern 168. For example, discrete semiconductor device 170 is mechanically and electrically connected to electrical circuit pattern 168. The discrete semiconductor devices can be a capacitor, resistor, inductor, or discrete transistor. Semiconductor package 172 includes interconnect substrate 174, semiconductor die 176 wire bonded to the interconnect substrate, and discrete semiconductor devices 178 mechanically and electrically connected to the interconnect substrate. Semiconductor die 176, discrete semiconductor devices 178, and interconnect substrate 174 are covered by encapsulant 180. Semiconductor package 172 is mechanically and electrically connected to electrical circuit pattern 168 with bumps 184. Semiconductor die 186 is mechanically and electrically connected to electrical circuit pattern 168 with bumps 188. FIG. 3b shows electrical components 170, 172, and 186 mounted to electrical circuit pattern 168. An optional encapsulant 190 can be deposited over SIP module 166 and electrical components 170, 172, and 186.

The electrical circuit pattern 168 embedded within encapsulant 140 provides design flexibility, while reducing SIP module height. The thickness of electrical circuit pattern 168 within encapsulant 140 remains constant, due to precision of the laser cutting the initial openings and the planarization after depositing the conductive material in the openings.

Figure 4A:
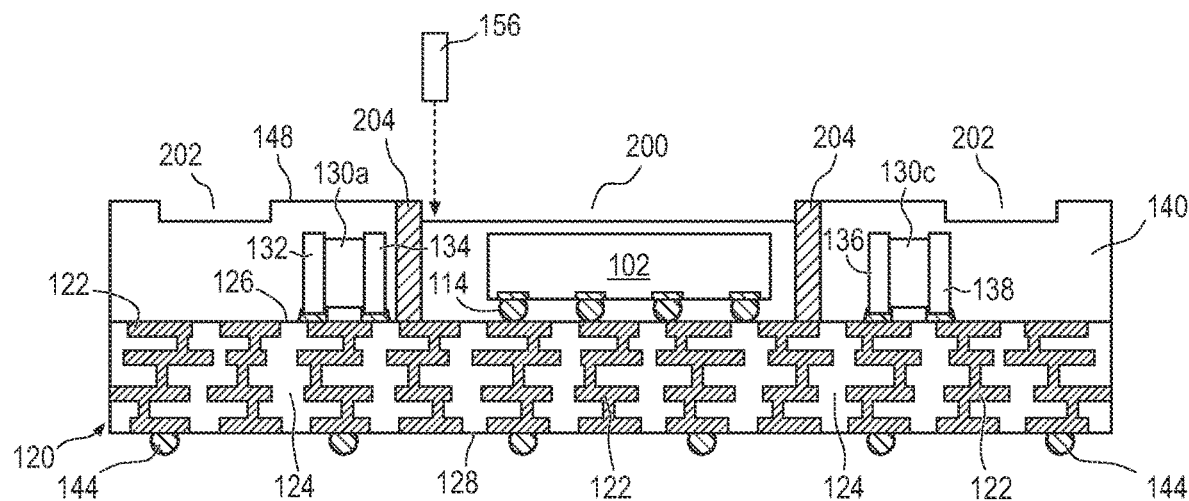
FIGS. 4a-4f illustrate a process of embedding a shielding layer and circuit pattern in the encapsulant of an SIP module.
Figure 4B:
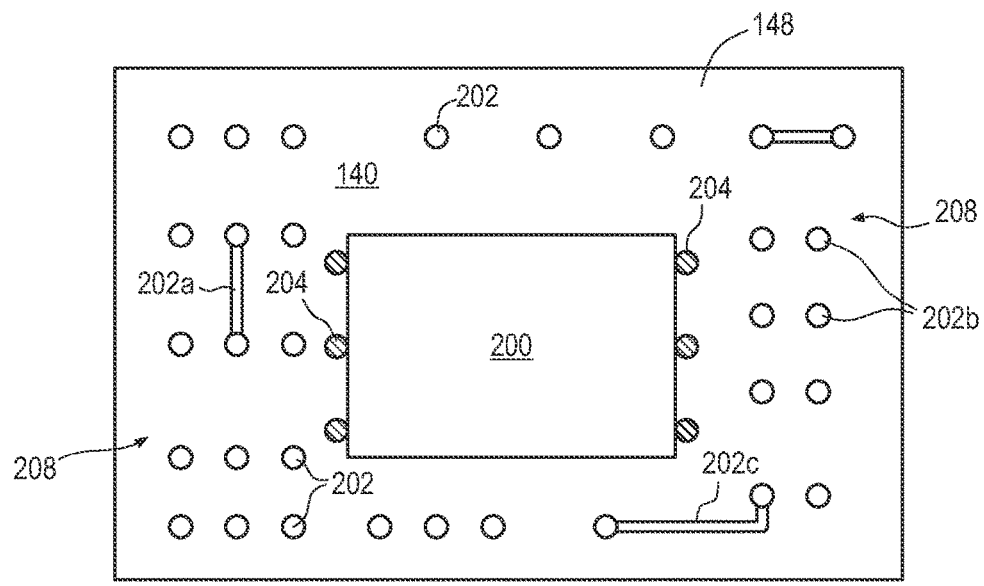

In an alternate embodiment, continuing from FIG. 2g, openings 200 and 202 are formed in surface 148 of encapsulant 140 using etching or LDA with laser 156, as shown in FIG. 4a. Components having a similar function are assigned the same reference number. Opening 200 is configured as an electromagnetic shielding layer. Conductive posts 204 are formed through encapsulant 140 around opening 200, similar to conductive post 152 in FIGS. 2f-2g. Openings 202 are arranged in a circuit pattern designated to interconnect various electric components via traces, RDL, contact pads, and other interconnect structure. FIG. 4b shows a top view of openings 200 and 202 formed in surface 148 of encapsulant 140 as general circuit pattern 208. For example, opening 202a will form a trace line, opening 202b will form a contact pad, and opening 202c will form an RDL. Openings 200 and 202 are shown wide in FIGS. 4a-4b for illustration purposes, i.e., the openings are not to scale. In practice, openings 200 and 202 correspond to a width of features in an actual semiconductor scale circuit pattern.

Figure 4C:
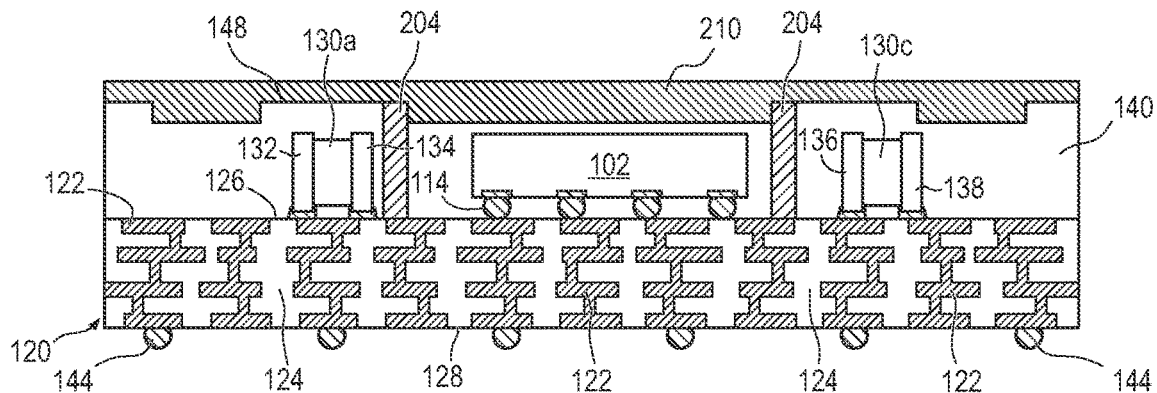

In FIG. 4c, a conductive material 210 is conformally applied to surface 148 of encapsulant 140. Conductive material 210 can be Al, Cu, Sn, Ni, Au, Ag, Ti, W, polysilicon, or other suitable electrically conductive material. Conductive material 210 is disposed over or covers surface 148 and fills openings 200 and 202, including all portions of circuit pattern 208, similar to FIG. 2k. Conductive material 210 contacts conductive posts 204.

Figure 4D:
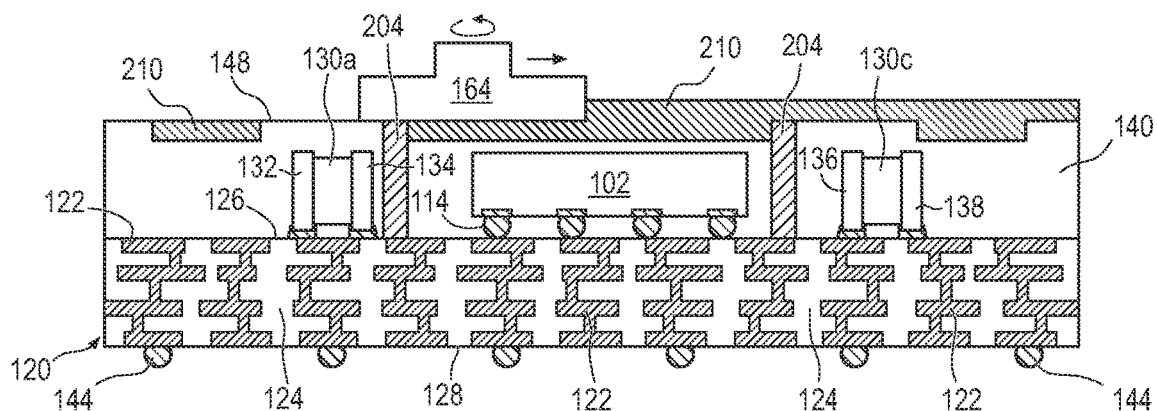
Figure 4E:
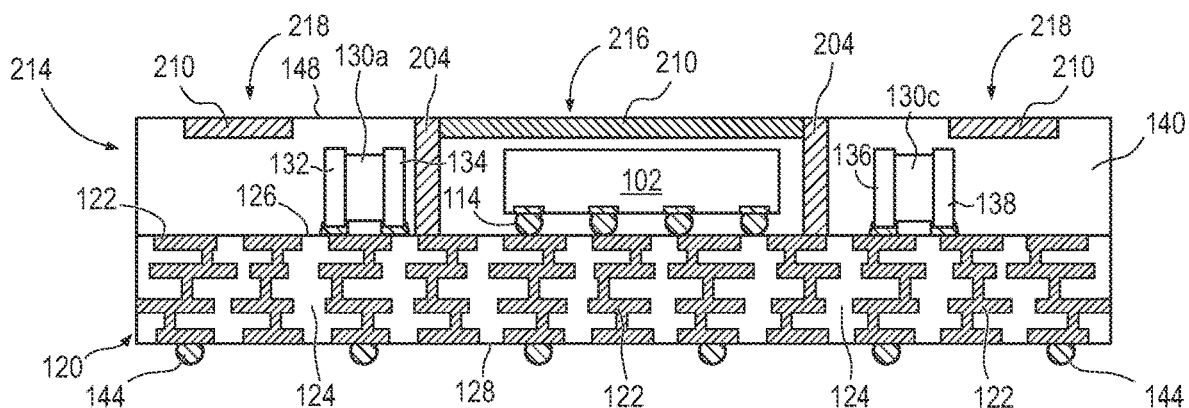
Figure 4F:
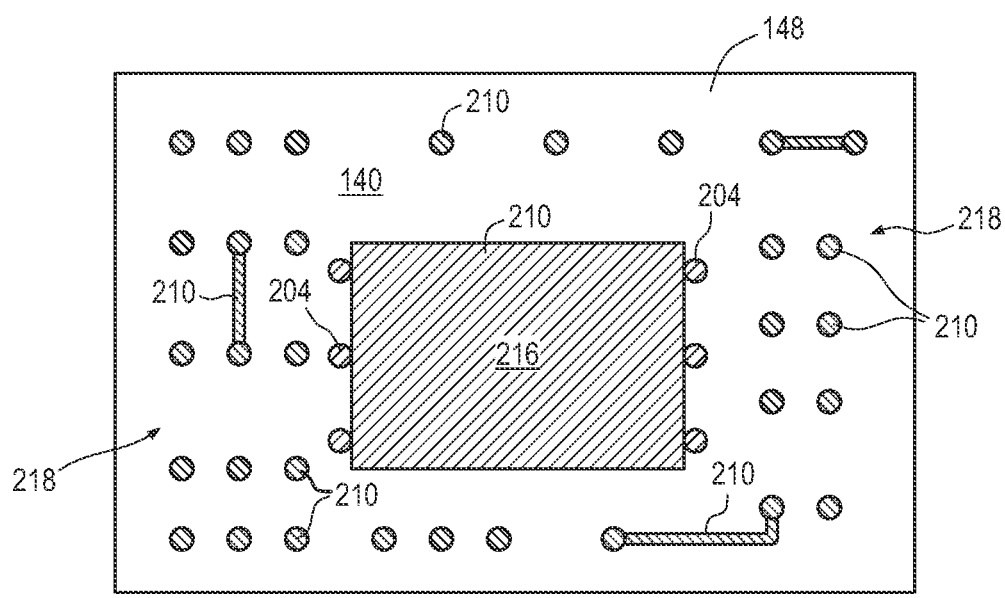

In FIG. 4d, a portion of conductive layer 210 is removed by grinder 164 to expose surface 148 and the conductive material in openings 200 and 202. The portion of conductive material in openings 200 and 202 remains in place. Grinder 164 planarizes surface 148 of encapsulant 140 and the surface of conductive material 210. Alternatively, a portion of conductive material 210 is removed by an etching process or LDA to expose surface 148 and the conductive material in openings 200 and 202. FIG. 4e shows SIP module or semiconductor component assembly 214 post-grinding with conductive material 210 in openings 200 and 202. In fact, the grinding process exposes conductive material 210 in openings 200 and 202 to form electromagnetic shielding layer 216 and electrical circuit pattern 218, as shown in FIG. 4f. Accordingly, electrical circuit pattern 218 is embedded with encapsulant 140. Electromagnetic shielding layer 216 can be grounded through conductive posts 204.

Figure 5A:
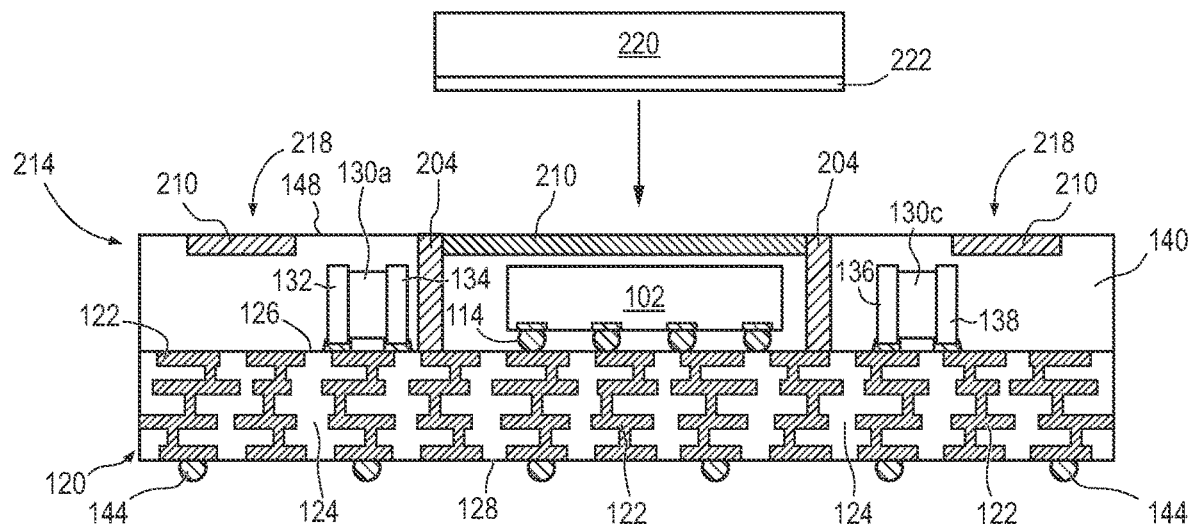
FIGS. 5a-5b illustrate a process of mounting an electrical component to the shielding layer and circuit pattern in the SIP module.
Figure 5B:
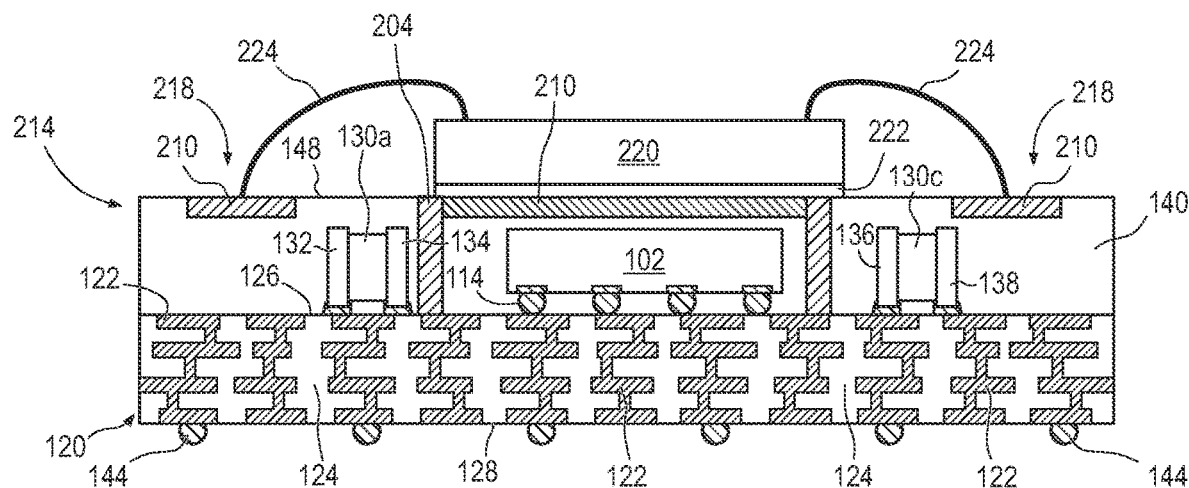

Various electrical components can be mounted to electrical circuit pattern 218 from FIGS. 4e-4f. In FIG. 5a, electrical component 220 is positioned over encapsulant 140 and electromagnetic shielding layer 216 using a pick and place operation. In FIG. 5b, electrical component 220 is mounted to electromagnetic shielding layer 216 with die attach adhesive 222. Electrical component 222 is electrically connected to electrical circuit pattern 218 with wire bonds 224.

SIP module 214, with electrical components 130a-130c, and electrical component 220 may contain IPDs that are susceptible to or generate EMI, RFI, harmonic distortion, and inter-device interference. For example, the IPDs contained within electrical component 220 provide the electrical characteristics needed for high-frequency applications, such as resonators, high-pass filters, low-pass filters, band-pass filters, symmetric Hi-Q resonant transformers, and tuning capacitors. In another embodiment, electrical component 220 contain digital circuits switching at a high frequency, which could interfere with the operation of IPDs in SIP module 214. Electromagnetic shielding layer 216 reduces or inhibits EMI, RFI, and other inter-device interference, for example as radiated by high-speed digital devices, from affecting neighboring devices within or adjacent to SIP module 214 or electrical component 220.

The electrical circuit patterns 218 embedded within encapsulant 140 provide design flexibility, while reducing SIP module height. The thickness of electrical circuit pattern 218 within encapsulant 140 remains constant, due to precision of the laser cutting the initial openings and the planarization after depositing the conductive material in the openings. Other circuit patterns can be formed within encapsulant 140, such as an antenna pattern and connector electrodes.

Figure 6:
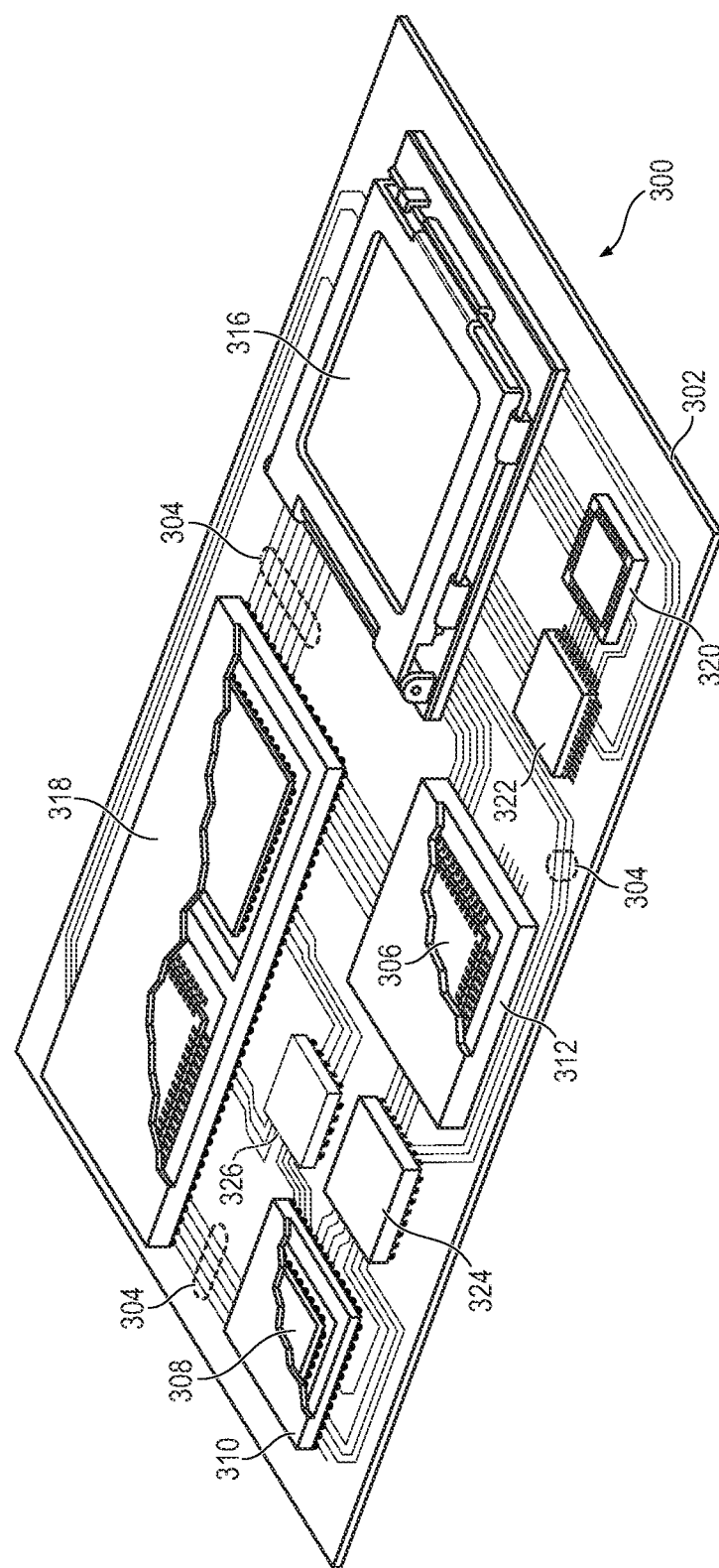
FIG. 6 illustrates a printed circuit board (PCB) with different types of packages mounted to a surface of the PCB.

FIG. 6 illustrates electronic device 300 having a chip carrier substrate or PCB 302 with a plurality of semiconductor packages mounted on a surface of PCB 302, including SIP modules 166 and 214. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 6, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor component assembly including a semiconductor component and an encapsulant disposed over the semiconductor component assembly and semiconductor component;
   forming a plurality of openings in a surface of the encapsulant including over at least a portion of the semiconductor component in a form of a circuit pattern;
   depositing a conductive material in the openings to form an electrical circuit pattern; and
   disposing an electrical component over the electrical circuit pattern.

2. The method of claim 1, further including:
   applying the conductive material over the surface of the encapsulant; and
   removing a portion of the conductive material to expose the electrical circuit pattern.

3. The method of claim 1, further including planarizing the surface of the encapsulant and the electrical circuit pattern.

4. The method of claim 1, wherein the electrical circuit pattern includes an interconnect structure.

5. The method of claim 1, wherein the electrical circuit pattern includes a shielding layer.

6. The method of claim 1, further including forming the plurality of openings in the encapsulant by laser.

7. A method of making a semiconductor device, comprising:
   forming a plurality of openings partially into a surface of an encapsulant in a form of a circuit pattern; and
   depositing a conductive material in the openings to form an electrical circuit pattern.

8. The method of claim 7, further including disposing an electrical component over and electrically connected to the electrical circuit pattern.

9. The method of claim 7, further including:
   applying the conductive material over the surface of the encapsulant; and
   removing a portion of the conductive material to expose the electrical circuit pattern.

10. The method of claim 7, further including planarizing the surface of the encapsulant and the electrical circuit pattern.

11. The method of claim 7, wherein the electrical circuit pattern includes an interconnect structure.

12. The method of claim 7, wherein the electrical circuit pattern includes a shielding layer.

13. The method of claim 7, further including forming the plurality of openings in the encapsulant by laser.

14. A semiconductor device, comprising:
   a semiconductor component assembly;
   an encapsulant disposed over the semiconductor component assembly;
   a plurality of openings formed into a surface of the encapsulant in a form of a circuit pattern;
   a conductive material deposited in the openings to form an electrical circuit pattern; and
   an electrical component disposed over the electrical circuit pattern.

15. The semiconductor device of claim 14, wherein the conductive material is disposed over the surface of the encapsulant.

16. The semiconductor device of claim 14, wherein the surface of the encapsulant and the electrical circuit pattern are planarized.

17. The semiconductor device of claim 14, wherein the electrical circuit pattern includes an interconnect structure.

18. The semiconductor device of claim 14, wherein the electrical circuit pattern includes a shielding layer.

19. The semiconductor device of claim 14, further including a laser to form the plurality of openings in the encapsulant.

20. A semiconductor device, comprising:
an encapsulant;
a plurality of openings formed into a surface of the encapsulant in a form of a circuit pattern; and
a conductive material deposited in the openings to form an electrical circuit pattern.

21. The semiconductor device of claim 20, further including an electrical component disposed over the electrical circuit pattern.

22. The semiconductor device of claim 20, wherein the conductive material is disposed over the surface of the encapsulant.

23. The semiconductor device of claim 20, wherein the surface of the encapsulant and the electrical circuit pattern are planarized.

24. The semiconductor device of claim 20, wherein the electrical circuit pattern includes an interconnect structure or shielding layer.

25. The semiconductor device of claim 20, further including a laser to form the plurality of openings in the encapsulant.

26. The semiconductor device of claim 20, further including a semiconductor component, wherein the encapsulant is deposited over the semiconductor component and the openings are formed over at least a portion of the semiconductor component.

27. The method of claim 7, further including providing a semiconductor component, wherein the encapsulant is deposited over the semiconductor component and the openings are formed over at least a portion of the semiconductor component.

28. The semiconductor device of claim 14, further including a semiconductor component, wherein the encapsulant is deposited over the semiconductor component and the openings are formed over at least a portion of the semiconductor component.

* * * * *